(12) United States Patent
Flinspach et al.

(10) Patent No.: US 10,196,711 B2
(45) Date of Patent: Feb. 5, 2019

(54) MELTING METHOD FOR ALLOYS

(71) Applicant: ALD Vacuum Technologies GmbH, Hanau (DE)

(72) Inventors: Jochen Flinspach, Hanau (DE); Frank Kunde, Maintal (DE); Thomas Hanselmann, Gelnhausen (DE); Markus Mangelsen, Altenstadt (DE)

(73) Assignee: ALD VACUUM TECHNOLOGIES GMBH, Hanau (DE)

( * ) Notice: Subject to any disclaimer, the term of this patent is extended or adjusted under 35 U.S.C. 154(b) by 229 days.

(21) Appl. No.: 14/951,577

(22) Filed: Nov. 25, 2015

(65) Prior Publication Data

US 2016/0153072 A1    Jun. 2, 2016

(30) Foreign Application Priority Data

Nov. 27, 2014  (DE) .................. 10 2014 117 424

(51) Int. Cl.
*C22B 9/04*   (2006.01)
*C22C 1/02*   (2006.01)
*H01J 37/305*  (2006.01)

(52) U.S. Cl.
CPC .............. *C22C 1/02* (2013.01); *C22B 9/04* (2013.01); *H01J 37/305* (2013.01); *H01J 2237/33* (2013.01)

(58) Field of Classification Search
CPC ..................................... C22C 1/02; C22B 9/04
See application file for complete search history.

(56) References Cited

U.S. PATENT DOCUMENTS

| 4,168,182 | A | * | 9/1979 | Rossmann | C21D 1/70 148/404 |
| 4,205,197 | A | * | 5/1980 | Omori | F27D 11/12 266/242 |
| 4,627,148 | A | * | 12/1986 | Imahashi | C22B 9/228 164/469 |
| 5,102,450 | A | | 4/1992 | Huang | |
| 5,690,891 | A | * | 11/1997 | Choudhury | C21C 5/5241 420/418 |
| 6,004,368 | A | * | 12/1999 | Chandley | C22B 9/003 420/408 |
| 8,636,825 | B2 | | 1/2014 | Schiefer et al. | |
| 2003/0010472 | A1 | | 1/2003 | Choudhury et al. | |
| 2013/0160967 | A1 | | 6/2013 | Suzuki et al. | |

FOREIGN PATENT DOCUMENTS

| DE | 69216171 T2 | 1/1991 |
| DE | 690 19 428 T2 | 11/1995 |
| DE | 699 36 736 T2 | 4/2008 |
| DE | 102010018303 A1 | 10/2011 |
| DE | 10 2012 112 982 A1 | 6/2013 |
| EP | 1006205 A2 | 11/1999 |
| EP | 1598434 A1 | 11/2005 |
| JP | H04173929 A * | 6/1992 |
| JP | 2002 275551 A | 9/2002 |
| JP | 2002275551 A * | 9/2002 |
| WO | 00 37201 A1 | 6/2000 |

OTHER PUBLICATIONS

Uher, C. "4.3.2 Temperature Dependence of Thermal Conductivity of Graphite." Landolt-Bornstein-Group III Condensed Matter, edited by O Madelung and G K White, vol. 15C, 1991, p. 430.*
Shibata, Tomoki et al. JP 2002275551 A published Sep. 25, 2002. Machine translation by Google.*
"Physical Constants of Organic Compounds," in CRC Handbook of Chemistry and Physics, 98th Edition (Internet Version 2018), John R. Rumble, ed., CRC Press/Taylor & Francis, Boca Raton, FL. pp. 12-203 and 12-204.*
JP 2002-275551 (published Sep. 25, 2002), human translation. (Year: 2002).*
European Extended Search Report, dated Apr. 13, 2016.
Chinese Office Action dated May 4, 2018 for corresponding Chinese application.

* cited by examiner

*Primary Examiner* — George Wyszomierski
*Assistant Examiner* — Tima M McGuthry-Banks
(74) *Attorney, Agent, or Firm* — Hudak, Shunk & Farine Co. LPA

(57) ABSTRACT

A method for producing metal alloys. The method allows the production of metal alloys consisting of at least two metals having a high melting point difference. Here, the higher melting metal is melted first and the lower melting metal is melted with a delay by means of heat transfer whereupon the metals mix together. This enables to obtain metal alloys with high purity and low evaporation losses, which in particular allow the use of contaminated starting components such as recycled metal.

9 Claims, No Drawings

MELTING METHOD FOR ALLOYS

FIELD OF THE INVENTION

The present invention relates to a method for producing metal alloys.

BACKGROUND OF THE INVENTION

The production of metal alloys is particularly challenging when the starting components used have high melting point differences. In such cases it may happen that the starting component with the lower melting point is vaporized, if the temperature required for melting the other component is set.

From the prior art methods are known which introduce a solid body of the higher melting material into a melt of the lower melting material. The higher melting material is then slowly absorbed by the melt. This process is very time consuming and thus costly. Moreover, the lower melting material is maintained for a long time at a high temperature, which promotes the evaporation.

An alternative method includes the simultaneous compacting of corresponding metal powders and then sintering the compact. This method is disadvantageous due to the grinding process and the energy required for sintering.

DE 692 16 171 T2 describes a method of melting titanium aluminide alloys in which the oxygen absorption of the alloy should be minimized during the melting process in a calcium oxide ceramic crucible. In order to achieve this, niobium is added to the alloy. In the method described therein it is provided to first melt the components aluminum and niobium among others. Subsequently the titanium is added to the melt. Moreover, an alternative method is described in which the starting metals are added in a solid form into the crucible. Herein, titanium is added as a solid onto the other components. In this way the effect should be achieved that the titanium melts as the last component and is therefore exposed to the ceramic crucible only for a very short time. The batch is heated using conventional methods such as induction, plasma, arc or resistance heaters. The method described in this document operates under atmospheric pressure and optionally under a protective gas such as argon. The melting point of titanium at atmospheric pressure is approximately 1660° C., that of aluminum only 660° C. Thus, the aluminum melts first. However, aluminum boils only at 2470° C. Consequently, here the problem of evaporation of the low melting metal does not arise. The oxygen contents of the alloys thus produced are well above 400 ppm.

SUMMARY OF THE INVENTION

A low oxygen content has a positive effect on the ductility of the alloy. According to the present invention, the lower oxygen content is to be achieved by melting the alloy under vacuum. Under vacuum the processing of metals with large melting point differences is, however, very problematic. Naturally, under vacuum the boiling point of a substance decreases more than the melting point. Thus, the boiling point of the lower melting metal is shifted closer to the required melting temperature of the alloy to be produced. This effect is the more pronounced the lower the pressure is. Consequently, in the production of the alloy the vaporization losses increase with decreasing pressure. Simultaneously, the purity increases with respect to volatile impurities and the oxygen content decreases as a whole.

A particular advantage is that in a vacuum melting process even raw materials can be used which contain impurities. These may eventually be removed in the melt due to the vacuum.

It is therefore an object of the present invention to provide a method which enables the production of metal alloys which comprise at least two metals with a high melting point difference. The method should enable the use of contaminated starting components (e.g. recycled metal) and make available metal alloys with high purity at low evaporation loss.

This object is achieved by the present invention.

DETAILED DESCRIPTION OF THE INVENTION

The method according to the present invention is a method for producing a metal alloy that can be used in particular as a master alloy. The alloy includes at least two metals as starting components. The method comprises the following steps:
 a. providing a solid body of a first metal or a first metal alloy in a crucible,
 b. adding a second metal onto the solid body in the crucible,
 c. melting the second metal,
wherein the melting point of the second metal is higher than the melting point of the first metal or the first metal alloy and at least the melting of the second metal takes place under vacuum. In order to obtain the desired alloy, the solid body is re-melted. However, the first metal or the first metal alloy is in the molten state only for a relatively short time, which significantly reduces the evaporation loss. Providing the solid body can comprise providing more than one solid body.

The first metal is provided as a solid body because the second metal typically has a higher density than the first one. If the second metal is applied onto the melt of the first metal, the second metal would sink and the success of the invention would not occur.

The metal alloy is preferably melted under vacuum. Vacuum means an absolute pressure of less than 1 bar, preferably less than 100 mbar, more preferably less than 10 mbar, more preferably less than 1 mbar and particular preferably less than 0.01 mbar. Of course, the method may also be carried out at other pressures. The advantages of the invention particularly occur under vacuum due to the more serious evaporation problems.

Preferably, the heat supply takes place from above. The heat supply is preferably carried out by use of an electron beam gun. Although other heat sources are conceivable, in particular those that enable heat supply from above, the electron gun has the advantage that the electron beam can be particularly well focused onto the second metal, if this rests on the solid body.

Due to the heat supply from above the second metal resting on the first metal or the first metal alloy is heated more intensely. That is, the second metal reaches the high temperatures necessary for its melting earlier than the first metal which is located underneath. Thus, the evaporation of the first metal or the first metal alloy is suppressed. In particularly preferred embodiments, the solid body is cooled.

Suppression of evaporation is more pronounced when the downward dissipation of heat is particularly large. For this reason, the melting process is preferably not carried out in a ceramic crucible, but preferably in a crucible having a high thermal conductivity. Preferably, it is a graphite crucible or a metal crucible, in particular a copper crucible. The crucible should preferably have a thermal conductivity of at least 40 W/(m*K), further preferably at least 100 W/(m*K), more preferably at least 200 W/(m*K). This should preferably apply at least to the bottom of the crucible and in particular to the crucible walls at least in the lower region thereof, too. In order to further enhance the heat dissipation downwardly, the crucible may be cooled at the floor and/or wall area by means of a coolant, such as water.

In order to enhance the dissipation of the heat downwardly, the solid body is preferably provided such that the first metal or the first metal alloy is melted in the crucible and allowed to re-solidify. Alternatively, a melt of the first metal or the first metal alloy may be poured into the crucible where the melt can solidify. By solidification of the melt of the first metal or the first metal alloy in the crucible a particularly intimate contact between the solid body and the crucible walls and bottom is achieved, which promotes the heat transfer. By means of the improved heat conduction the evaporation of the first metal is in particular reduced by delaying the melting process.

The first metal may be pre-inserted in the crucible in the form of granules, wires, grains, pellets, chips, or mixtures thereof. The first metal is preferably a reactive metal, a noble metal or aluminum. Particularly preferable are reactive metals. Preferred first metals are aluminum, titanium, gold and vanadium. As the first metal alloy alloys can be used, which contain the aforementioned first metals or consist thereof. The first metal or the first metal alloy preferably has a melting point of less than 1,700° C., further preferably less than 1,200° C., and more preferably less than 800° C.

The second metal is preferably added in a solid form, particularly in the form of granules, grains, wires, pellets, chips or mixtures thereof. This small-part addition of the second metal allows a relatively rapid melting, and moreover the thermal conductivity of coarse-grained bulk materials is relatively low. Thus, the too rapid heating of the first metal or the first metal alloy beneath the second metal is further delayed. Moreover, the total process time is shortened and the evaporation rate of the first metal is significantly reduced. As a positive side effect it is noted that the second metals in question here are often recovered in the form of particles from recycling processes. For example, tantalum wires are obtained in the recycling of mobile phones. Thus, a preparatory treatment is preferably not required.

The second metal is preferably put on the solid body such that a coverage of the surface of the solid body as uniform as possible is achieved. The solid body of the first metal or metal alloy is preferably covered to an extent of at least 60%, preferably at least 70%, more preferred at least 85% and most preferred at least 95%. That is the covered proportion of the surface of the solid body. In preferred embodiments the solid body is completely covered.

It has proven to be advantageous to select an average grain size below 25 mm for the particles, in which form the second metal is preferably added. More preferably the grain size is below 15 mm, more preferably below 10 mm, further preferably below 5 mm, and most preferably below 3 mm. If a too large particle size is selected a longer melting period has to be expected due to the lower specific surface area of the bulk of the second metal. The same applies to a too small grain size. Small particles moreover tend to electrostatic charging, which would interfere with the process as a whole. Therefore, the average grain size of the particles should not be below 200 µm, more preferably 400 µm and particularly preferably 1 mm. "Particle size" means the Martin diameter determined by light microscopy, i.e. the length of the chord that divides the projection surface of the particles parallel to the measuring direction into two halves.

It has been found that the mentioned small particle size of the second metal deteriorates the heat transfer from the second metal to the first metal. According to the invention, preferably the heat input to the second metal is carried out from above, in particular by means of an electron beam gun. Due to the poor heat transfer from top to bottom, the first metal melts much later and the evaporation is reduced.

The second metal is preferably a reactive or refractory metal, i.e., in particular a metal having a melting point equal to or above that of titanium (1,660° C.) in particular even above 2,000° C. Thus, particularly preferred are titanium, zirconium, vanadium, chromium, hafnium, niobium, tantalum, molybdenum and tungsten. Particularly preferred are tantalum, niobium and titanium. In particular embodiments the first metal, too, can be a refractory metal.

The metals or metal alloys are preferably chosen such that their melting points are different from each other at least by 500° C., more preferably at least by 750° C., more preferably at least by 1,000° C. and particularly preferably at least by 1,200° C. The second metal has the higher melting point.

Moreover, more than two metals can be processed. The third and further metals are then added depending on their melting points together with the first metal, with the second metal or in-between. Preferably, an alloy of tantalum and aluminum, tantalum and titanium or niobium and titanium is produced by the method.

The proportions depend on the desired alloy. Normally, the first metal or the first metal alloy is inserted in a larger amount than the second metal. Preferably, the amount of the second metal relative to the first metal is at least 5 wt.-%, preferably at least 10 wt.-%, more preferably at least 20 wt.-% and particularly preferably at least 30 wt.-%. Naturally, the melting point of the alloy to be produced increases with the content of a higher melting metal. Preferably, the content of the second metal does not rise above the value which leads to a melting point of the alloy to be produced which is more than 1000 K above the boiling point of the first metal. Preferably, the proportion of the second metal relative to the first metal is at most 50 wt.-%, more preferably at most 40 wt.-%. The composition of the alloy to be produced may be adjusted by addition of further metals or other dopants. Preferably, the sum of the first metal or the first metal alloy and the second metal is at least 75 wt.-%, further preferably at least 85 wt.-%, more preferably at least 95 wt.-% and particularly preferably at least 99 wt.-% of the alloy produced.

In one embodiment, the boiling point of the first metal or the first metal alloy is lower than the melting point of the second metal. The term "boiling point" or "melting point" in the present application means that these temperature points indicate the properties of the respective material under standard conditions (DIN 1343, i.e. a pressure of 101,325 kPa). The term "metal" in the present application also includes metal alloys.

The method according to the invention allows to reduce the evaporation loss of the lower melting metal to a low single-digit percentage amount. Preferably the evaporation loss of the first metal or the first metal alloy is at most 5 wt.-%, more preferably at most 3 wt.-%, with respect to the first metal or the first metal alloy.

By means of the method according to the invention alloys can be produced which have an oxygen content of less than 400 ppm, preferably less than 200 ppm and particularly preferably less than 100 ppm. This is even possible with recycled feedstock.

In the method according to the invention, the starting components are heated in the crucible to a temperature which at least corresponds to the melting point of the alloy to be produced.

As is apparent from the description, the present method includes melting of the first metal or metal alloy, the manufacture of an alloy from the molten material, and the removal of the alloy from the crucible.

EXAMPLE

First aluminum is provided in the form of granules in a knob crucible. These are melted by means of an electron beam gun with low power and consolidated into a massive knob. Contrary to expectations, the evaporation losses proved to be very low, namely less than 3%.

The obtained knob has a very good contact with the cold crucible wall and correspondingly a high heat conduction. The surface of the knob is covered with tantalum wires. This bulk compared to the aluminum block has a very poor heat conduction, whereby during the subsequent heating of the tantalum layer the latter is heated up close to its melting temperature and then liquefies the aluminum by heat conduction and mixes with the tantalum layer.

Surprisingly, in this melting experiment an evaporation of aluminum of less than 1% has been found.

While in accordance with the Patent Statutes, the best mode and preferred embodiments have been set forth, the scope of the invention is not limited thereto, but rather by the scope of the attached claims.

What is claimed is:

1. A method for producing a metal alloy including at least two metals, comprising the steps of:
   providing a solid body of a first metal or a first metal alloy in a crucible,
   adding a second metal in a solid form to rest on the solid body in the crucible,
   providing that the melting point of the second metal is higher than the melting point of the first metal or the first metal alloy; and
   applying heat under a vacuum to the second metal from above the second metal and melting the second metal whereby the second metal starts to melt earlier than the melting of the first metal or the first metal alloy.

2. The method of claim 1, wherein providing the solid body includes the following steps:
   introducing the first metal or the first metal alloy into the crucible;
   melting the first metal or the first metal alloy; and
   solidifying the melt of the first metal or the first metal alloy to form the solid body.

3. The method according to claim 1, wherein the second metal is added in the form of granules, grains, wires, pellets, chips, or mixtures thereof.

4. The method according to claim 1, wherein the second metal is added in average grain sizes of less than 25 mm.

5. The method according to claim 1, wherein the melting is conducted under vacuum of less than 100 mbar absolute.

6. The method according to claim 1, including using an electron beam gun is used as a heat source.

7. The method according to claim 1, wherein the crucible has a thermal conductivity of at least 40 W/(m*K).

8. The method according to claim 1, wherein the melting point difference between the second metal and the first metal or the first metal alloy is at least 500° C.

9. The method according to claim 1, wherein applying heat under vacuum causes melting of the first metal or of the first metal alloy, wherein melting of the first metal or of the first metal alloy causes evaporation thereof, and wherein the amount of evaporation loss of the first metal or the first metal alloy is at most 5 wt.-%.

* * * * *